United States Patent [19]

Henderson et al.

[11] 4,366,446

[45] Dec. 28, 1982

[54] FEEDBACK LINEARIZATION OF CASCODE AMPLIFIER CONFIGURATIONS

[75] Inventors: Elmer L. Henderson, Philadelphia, Pa.; Henry F. Inacker, Cinnaminson, N.J.

[73] Assignee: RCA Corporation, New York, N.Y.

[21] Appl. No.: 199,599

[22] Filed: Oct. 22, 1980

[51] Int. Cl.³ .......................... H03F 3/45; H03F 1/34
[52] U.S. Cl. ..................................... 330/260; 330/311
[58] Field of Search ................. 330/69, 252, 260, 311

[56] References Cited

U.S. PATENT DOCUMENTS

| | | | |
|---|---|---|---|
| 3,275,944 | 9/1966 | Lavin | 330/261 |
| 3,287,653 | 11/1966 | Goordman | 330/260 |
| 3,482,177 | 12/1969 | Sylvan | 330/256 |
| 3,499,104 | 3/1970 | Austin | 178/73 |
| 3,541,234 | 11/1970 | Austin | 330/300 |
| 3,541,465 | 11/1970 | Nagata et al. | 330/258 |
| 4,121,169 | 10/1978 | Iwamatsu | 330/296 |

*Primary Examiner*—James B. Mullins
*Attorney, Agent, or Firm*—Samuel Cohen; Joseph S. Tripoli; Christopher L. Maginniss

[57] ABSTRACT

A resistor inserted between the collector of a common emitter transistor in a cascode amplifier and the emitter of the ensuing common base-amplifier transistor in conjunction with an operational amplifier responds to the collector current of the common emitter transistor to develop a degenerative-feedback-voltage signal for application to its emitter-base circuit.

5 Claims, 1 Drawing Figure

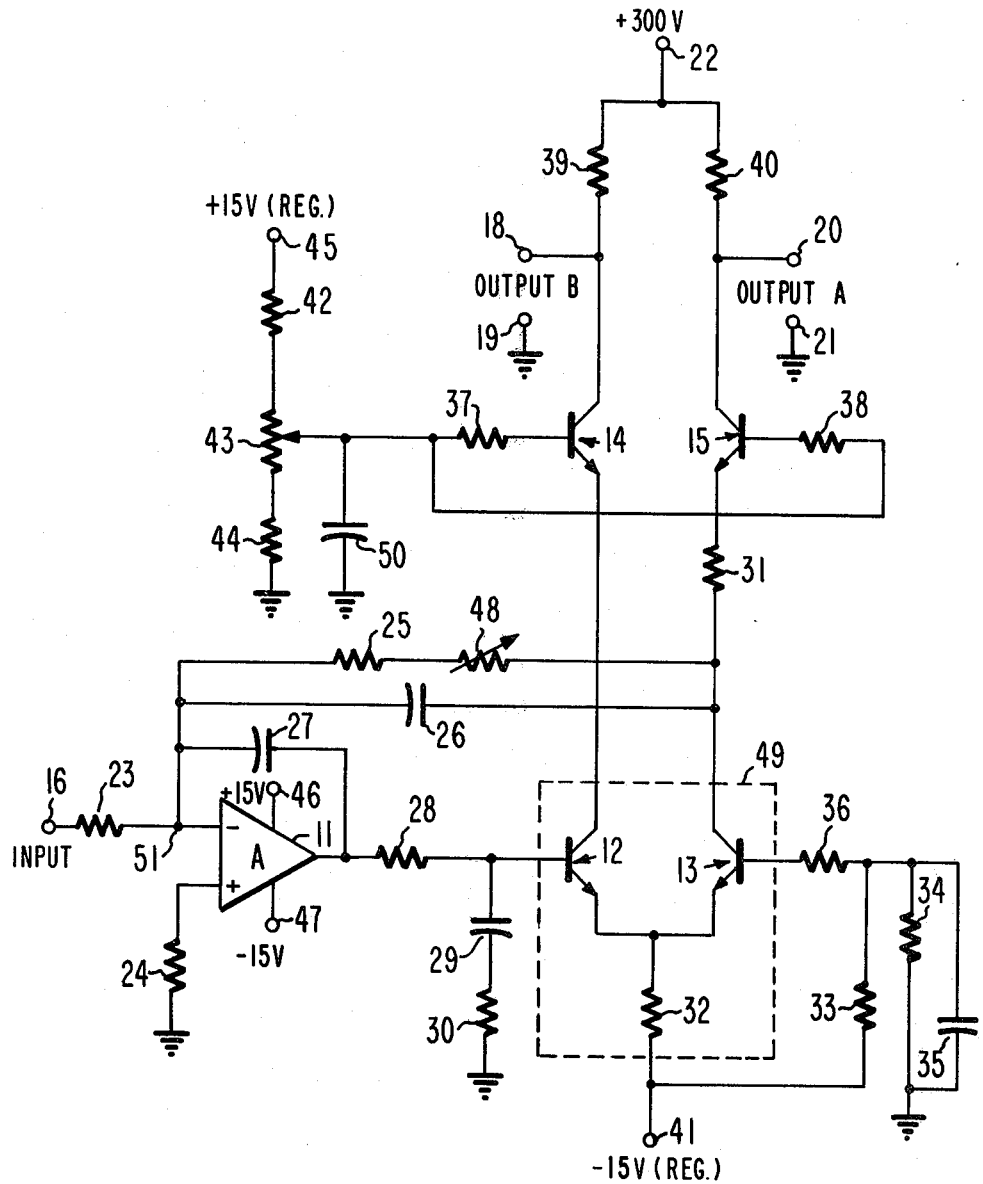

FEEDBACK LINEARIZATION OF CASCODE AMPLIFIER CONFIGURATIONS

The present invention relates to feedback linearization of cascode amplifiers.

A cascode amplifier is formed by common-emitter transistor amplifier followed in direct coupled cascade by a common-base transistor amplifier. W. M. Austin, in U.S. Pat. No. 3,449,104, issued Mar. 3, 1970 and entitled "Video Output Stage Employing Stacked High Voltage and Low Voltage Transistors," teaches the use of a relatively wide-bandwidth, low-voltage transistor in the common-emitter amplifier and a relatively narrow-bandwidth, high-voltage transistor in the common-base amplifier to secure an amplifier for providing an amplifier with both the relatively wide bandwidth and high-voltage capabilities. In his later U.S. Pat. No. 3,541,234, issued Nov. 17, 1970, and entitled "Video Circuits Employing Cascoded Combinations of Field Effect Transistors with High Voltage, Low Bandwidth Transistors," he extends his teaching to replace the common-emitter bipolar transistor amplifier with a common-source field effect transistor amplifier. Differential amplifier connections of cascode amplifiers are also known in which the common-emitter (or common-source) amplifier transistors are interconnected at their emitter (or source) electrodes. Refer, for example, to U.S. Pat. No. 3,482,177 (Sylvan), issued Dec. 2, 1969, and entitled "Transistor Differential Operational Amplifier;" U.S. Pat. No. 3,541,465 (Nagata et al.), issued Nov. 17, 1970, and entitled "Transistor Differential Amplifier Circuit;" or U.S. Pat. No. 4,121,169 (Iwamatsu), issued Oct. 17, 1978, and entitled "Amplifier Device." Such arrangements may be modified to apply input drive signal in unbalanced form to the base of only one of the "common-emitter-amplifier" transistors, the base of the other transistor being at signal ground to operate that transistor as a common-base (rather than common-emitter) amplifier transistor; and the term "cascode" as used in this disclosure is extended to include cascode of common-base amplifiers.

A differential amplifier connection of cascode amplifiers so modified was used by the present applicants for generating the deflection voltages for an electrostatically deflected cathode ray tube (CRT). The several hundred volt peak-to-peak deflection voltage requirement was met by using balanced drive from the collector circuits of the high-voltage common-base-amplifier transistors. The problem of linearizing feedback for such an amplifier had to be considered. Prior-art cascode connections used emitter degeneration resistance with the common-emitter transistor to afford current feedback, or used voltage feedback from the collector of the common-base amplifier transistor back to the base of the common-emitter transistor. The use of the former form of feedback is undesirable in differential amplifier configurations where input signal drive is of the unbalanced form described in the previous paragraph, since it causes the cascode amplifiers to have different levels of input signal coupled to them. The use of the latter form of feedback is undesirable in that it results in unequal output impedances at the common-base collector outputs and it also exposes low-voltage circuits to the hazard of application of destructive or damaging high voltage under unusual circumstances—e.g., during initial application of operating voltages or during an arc-over in the CRT.

The present invention is embodied in a cascode amplifier where the voltage to be used for linearization of a low-voltage amplifier transistor (as well as preceding amplifier circuitry, if desired) is taken across a resistor connecting its collector to the emitter of a high-voltage transistor in a following common-base-amplifier, which amplifier is inherently a linear amplifier insofar as current is concerned and will provide a linear output voltage to a fixed-resistance collector load.

In accordance with one embodiment of the present invention a linearized high voltage amplifier is disclosed which provides a linearly amplified high voltage output of an input signal. The amplifier is coupled to first, second and third potentials, wherein the difference between the first and second potentials is small and the difference between the first and third potentials is relatively larger. The apparatus includes a first impedance and the means for coupling the third potential to a first terminal of that impedance. A second impedance, smaller than the first, and means for coupling the second potential to a first terminal of the second impedance, are also provided. Means including coupling means when coupled between the first and second potentials for generating a constant current between the coupling means includes input signal circuitry to which the input signal is applied and first and second output signal circuits which provide, in response to the signals applied to the input signal circuitry, first and second output signals having currents which sum is the constant current. The currents of the signals at the first and second output circuits have complementary variations. The amplifier further includes a current conducting device having an input terminal coupled to one of the output signal circuits of the constant current generating means and having an output terminal coupled to the second terminal of the first impedance. Means for coupling the second terminal of the second impedance are provided for applying the first constant current generating means output signal to the second impedance to generate a voltage across it which is proportional to the current of the output signal. Finally, degenerative feedback means coupled to the input signal circuitry and responsive to the voltage across the second impedance provide a signal proportional to that voltage to thereby linearize the first and second output signals.

In The Drawing:

The sole FIGURE is a circuit diagram of a differential cascode amplifier providing linearizing feedback according to the present invention.

Referring to the FIGURE, the basic circuit comprises an operational amplifier 11 which drives an emitter-coupled differential amplifier 49, including transistors 12 and 13 and resistor 32, and a pair of grounded-base, high-voltage transistors 14 and 15, in cascode combination with the differential amplifier 49, which act as level shifters. A signal applied to input terminal 16 is reproduced at high amplification at output terminal 18 and the inverse of the signal at output terminal 18 appears at output terminal 20. Negative feedback responsive to the voltage developed across a resistor 31 in one cascode leg is applied via resistor 25 and variable resistor 48 to the summing point 51 input of operational amplifier 11, in accordance with the invention, assuring stable, linear gain for the frequency range of interest.

Input terminal 16 is connected via input resistor 23 to the inverting (−) input of amplifier 11. Operational amplifier 11 is suitably a type CA741 operational amplifier sold by RCA Solid State Division, Somerville, N.J., Having a non-inverting (+) input connected via resistor 24 to ground and an inverting (−) input connected to input resistor 23, feedback resistor 25 and bandwidth shaping capacitors 26 and 27. Amplifier 11 connects to a positive operating potential (e.g., +15 V) at terminal 36 and to a negative operating potential (e.g., −15 V) at terminal 47. Amplifier 11 produces an output voltage proportional to the voltage applied through the input resistors 24 and 23 connected to its non-inverting (+) and inverting (−) inputs, respectively. Because the non-inverting (+) input of amplifier 11 is tied through resistor 24 to ground, the output of amplifier 11 will respond in polarity opposite to the signal applied at the inverting (−) input.

The signal at the output of amplifier 11 is applied via resistor 28 to the base electrode of transistor 12, part of differential amplifier 49. Resistor 28 serves two functions: as a series resistor in the base circuit it acts as a parasitic suppressor, and in combination with capacitor 29 and resistor 30 it provides a break network to shape the frequency versus gain response of the overall circuit. Capacitor 29 and resistor 30 provide, at very high frequencies, a low-impedance path to ground which prevents possible high-frequency parasitic oscillators from being impressed on the signal driving the base of transistor 12. Capacitor 27, connected between the output and the inverting (−) input terminals of amplifier 11, is used to shape the high-frequency response of amplifier 11.

Emitter-coupled differential amplifier 49 comprises NPN transistors 12 and 13 and resistor 32. Transistors 12 and 13 are both suitably type 2N2219A sold by Motorola Semiconductor Products, Inc., Phoenix, Arizona. The interconnected emitters of transistors 12 and 13 connect to one end of resistor 32; the other end of resistor 32 connects via terminal 41 to a negative operating potential (e.g., −15 V). A fixed voltage maintained across resistor 32 ensures that a constant current flows through it. Hence, using Kirchhoff's Law, it can be seen that the sum of the currents through transistors 12 and 13 will be constant, thus characterizing differential amplifier as a constant current generator. A signal applied to the base of transistor 12 which results in current variations at the collector of the transistor must, by the symmetry of differential amplifier 49, cause variations in the current at the collector of transistor 13 which are complementary to those at the collector of transistor 12.

A voltage divider comprising resistors 33 and 34 connected in series between ground and the negative operating potential at terminal 41 provides a d-c voltage at the base of transistor 13. Capacitor 35, connected between the junction of resistors 33 and 34 and ground, bypasses any signal components appearing at the base of transistor 13 to signal ground. Resistor 36, between the base of transistor 13 and the junction of resistors 33 and 34, acts as a parasitic suppressor to prevent possible high frequency parasitic oscillations at that electrode.

The series combination of resistor 25 and variable resistor 48 provides negative feedback for the cascode of operational amplifier 11 and differential amplifier 49. The gain of the amplifier combination is determined by the setting of variable resistor 48. Because no substantial current flows into the inverting (−) input of amplifier 11, the current through input resistor 23 is substantially equal to the current through the feedback resistors 25 and 48. Therefore, the gain of the amplifier combination comprising operational amplifier 11 and differential amplifier 49 is equal to the sum of the resistances of resistor 25 and variable resistor 48 divided by the resistance of input resistor 23. Capacitor 26, connected between the inverting input of amplifier 11 and the output of the differential amplifier 49 at the collector of transistor 13, provides bandwidth shaping for the amplifier combination which includes operational amplifier 11 and differential amplifier 49.

HIgh-voltage NPN transistors 14 and 15 are connected in cascode combination with transistors 12 and 13, respectively, of differential amplifier 49. For the example, transistors 14 and 15 are each of the type 2N3439 sold by Semiconductor Technology, Inc., of Stuart, Florida, which have a rated breakdown voltage of 450 volts between collector and emitter. Where still larger output voltages require a larger d-c operating potential, transistors with a higher rated breakdown voltage may be selected.

Resistors 39 and 40 connect the collectors of transistors 14 and 15, respectively, to a terminal 22 to which a high-voltage (e.g., 300 V) operating potential is applied. One output of the amplifier of the instant embodiment, output B, is measured at the output terminal 18, with respect to the ground potential at terminal 19, and is one of the differential outputs of the overall amplifier. Output A which is the other differential output measured at output terminal 20 is connected to the collector of transistor 15 and is referenced to the ground potential at output terminal 21. Balanced output voltages developed across collector resistors 39 and 40 appear between terminals 19 and 18 and between terminals 21 and 20, respectively.

The base electrodes of level shifter transistors 14 and 15 receive a d-c bias voltage via parasitic supression resistors 37 and 38, respectively, from an adjustable potential divider comprising resistors 42 and 44 and potentiometer 43, in series between ground and terminal 45, to which a positive operating potential (e.g., 15 V) is applied. Capacitor 50 by-passes the tap connection of potentiometer 43 to ground for any signal components appearing at the base electrodes of transistors 14 and 15. In the example, the d-c bias voltage applied to the bases of transistors 14 and 15 is nominally +5 volts and can be used as a CRT deflection centering control.

Resistor 31 connecting the collector of transistor 13 and the emitter of transistor 15 is used to develop the feedback voltage which linearizes the cascade connection of amplifiers 11 and 49 and sets the quiescent current level through the branch of the output circuit comprising transistors 13 and 15. Resistor 31 is small in relation to collector resistor 40 and the voltage drop developed across it is proportionally smaller than the drop across resistor 40, by Ohms's Law. The voltage drop across resistor 31 is the difference between the voltage at the emitter of transistor 15 which, in the common-base configuration, is a fixed d-c bias, and the signal at the collector of transistor 13.

The degenerative feedback signal developed across resistor 25 and variable resistor 48 in response to the signal developed across resistor 31 is combined with the signal applied to input terminal 16 (via resistor 23) so as to generate a signal at the output of operational amplifier 11 which will maintain transistor 12 in its linear range. This ensures linear output signals from differential amplifier 49, resulting in linear amplification of the signal at input terminal 16 at outputs A and B.

The direct-coupled voltage feedback from the output of transistor 13 to the inverting (−) input of amplifier 11 maintains that input at the same potential (virtual ground) as applied to its non-inverting (+) input via resistor 24. So with zero voltage at input terminal 16, there is essentially no current flow through resistor 23 or into the input of operational amplifier 11, so the current through the feedback path, comprising resistor 25 and variable resistor 48, must be zero, to satisfy the requirement that the net current flow at the summing point 51 be zero. If no current flows through the feedback path, the voltage at the collector of transistor 13 must be zero volts to satisfy Ohm's Law.

Under this zero-voltage input condition, the voltage drop across resistor 31 is the voltage at the base electrode of transistor 15 less the base-emitter voltage drop across the transistor, the voltage drop across resistor 38 being negligibly small. The current flowing in the branch comprising transistors 13 and 15 is determined (in accordance with Ohm's Law) by dividing the drop across resistor 31 by its resistance, and the voltage at output terminal 20, output A, with respect to the reference ground at output terminal 21, may be determined (again in accordance with Ohm's Law) by computing the voltage drop across collector resistor 40 and subtracting that voltage drop from the voltage applied at high voltage terminal 22.

The current flowing in the branch comprising transistors 12 and 14 is the "tail" current demanded at the interconnected emitters of the transistors in differential amplifier 49 less the current in the branch comprising transistors 13 and 15, from Kirchoff's Law considerations. This "tail" current is the current flowing through resistor 32 and can be determined according to Ohm's Law by dividing the voltage drop across resistor 32 by its resistance. Voltage dividing resistors 33 and 34 provide a volage at the base of transistor 13 with reference to the voltage at the terminal 41. That base voltage, less the base-to-emitter voltage drop across transistor 13, is essentially the voltage which appears across resistor 32, the voltage drop across the parasitic suppression resistor 36 being negligible.

Knowing the current in the branch comprising transistors 12 and 14, one can calculate by Ohm's Law the potential drop across collector resistor 39. The voltage applied to high voltage terminal 22 less the voltage drop across resistor 39 yields the voltage at output terminal 18, output B, with respect to the reference ground at output terminal 19.

For positive voltages applied at input terminal 16, a current flows through input resistor 23. Because substantially no current flows into the operational amplifier 11, and because the voltage at summing point 51 is at virtual ground, the same current flowing through resistor 23 must flow through feedback resistors 25 and 48; hence the voltage at the collector of transistor 13 will drop to some negative value in response to positive voltage applied at input terminal 16. The voltage on the collector of transistor 13 may be quantitatively expressed as:

$$V = -V_{in}(R_f/R_{in}),$$

where $V_{in}$ is the input voltage, $R_{in}$ is the input resistor 23, and $R_f$ is the feedback resistance, which is the sum of resistor 25 and variable resistor 48.

As the voltage at the collector of transistor 13 drops from zero volts, under the zero input voltage condition, to a negative voltage, in response to a positive input voltage, the voltage across resistor 31 increases because the voltage at the emitter of transistor 15 is fixed. The results in increased current flow through the branch including transistors 13 and 15, resulting in a greater voltage drop across resistor 40 and hence a lower voltage appearing at output terminal 20 with respect to the ground potential at output terminal 21.

The increased current flow in the branch including transistors 13 and 15, in response to a positive voltage applied at input terminal 16, causes a decreased current flow in the branch comprising transistors 12 and 14, because of the constant-current requirement of differential amplifier 49. The decreased current flow results in a decreased voltage drop across collector resistor 39 and hence a higher voltage appearing at output terminal 18 with respect to the ground potential at output terminal 19.

A circuit as described in connection with the FIGURE was constructed and tested with components having the following values:

| | |
|---|---|
| Resistor 23 | 100 K. ohms, |
| Resistors 24 and 25 | 38.3 K. ohms, |
| Resistors 28, 33, and 34 | 1000 ohms, |
| Resistors 30, 37, and 38 | 47 ohms, |
| Resistor 31 | 1330 ohms, |
| Resistor 32 and 42 | 750 ohms, |
| Resistor 36 | 100 ohms, |
| Resistors 39 and 40 | 34 K. ohms @ 4 watts, |
| Resistor 44 | 316 ohms, |
| Variable resistor 48 | 0 to 50 K. ohms, |
| Potentiometer 43 | 200 ohms, |
| Capacitor 26 | 10 picofarads, |
| Capacitor 27 | 47 picofarads, |
| Capacitor 29 | 0.01 microfarads, |
| Capacitors 35 and 50 | 1.0 microfarad. |

Deriving the feedback signal from the low-voltage (emitter) side of level shifter transistor 15 provides the advantage of feedback stability. The voltage at the emitter of transistor 15 depends only on the d-c bias voltage applied at the base electrode. In this embodiment the common-base voltage is derived from a +15 volt supply; normally, a well-regulated power supply is used in this application. The voltage at the collector of transistor 15 depends on the high-voltage operating potential which rarely is a well-regulated voltage. Hence, greater stability is achieved in the circuit as a result of deriving the feedback signal from the more well-regulated voltage supply.

While the present invention has been described in the context of an amplifier arrangement with a pair of differentially connected cascodes to deliver balanced output signals, single-ended arrangements are also possible. Output A between terminals 21 and 20 can be dispensed with, eliminating collector resistor 40 and replacing high voltage transistor 15 with a low-voltage type with its collector returned to the +15 V supply, or dispensing with both collector resistor 40 and transistor 15 and returning the end of resistor 31 remote from the collector of transistor 13 to a positive operating potential relatively low compared to +300 V. In the alternative, output B can be dispensed with eliminating collector resistor 39 and transistor 14 and connecting the collector of transistor 12 directly to the +15 V supply.

The foregoing description has dealt with level shifter transistors 14 and 15 as bipolar transistors. However, it should be obvious to one skilled in the art to substitute field-effect transistors (FET's) for the bipolar types, with the gate, source and drain electrodes corresponding, respectively, to the base, emitter and collector electrodes. For that reason, claims which specify transistors should be construed as applying equally to either type of semiconductor device.

What is claimed is:

1. A linearized high voltage amplifier for providing a linearly amplified high voltage output of an input signal when coupled to a first fixed potential, a second fixed potential, and a third fixed potential, with said second and third potentials having respective differences from said first potential that are relatively small and large respectively, said amplifier comprising:
   a first impedance having first and second terminals and means for coupling said third potential to the first terminal of said first impedance;
   a second impedance that is a fraction of said first impedance having first and second terminals and means for coupling said second potential to the first terminal of said second impedance;
   means including coupling means when coupled between said first and said second potentials for generating a constant current between said coupling means, said constant current generating means including input signal circuitry to which said input signal is applied and first and second output signal circuits for providing in response to signals applied to said input signal circuitry first and second output signals having currents which sum is said constant current, said first and second output signal currents having complementary variations at said first and second output signal circuits, respectively;
   a first current conducting device having an input electrode coupled to one of said first and second output signal circuits of said constant current generating means and having an output electrode coupled to the second terminal of said first impedance
   means for coupling the second terminal of said second impedance to said first output signal circuit for applying said first output signal of said constant current generating means to said second impedance to produce a voltage thereacross proportional to the current of said first output signal; and
   degenerative feedback means coupled to said input signal circuitry and responsive to the voltage across said second impedance for providing a signal proportional to said voltage to said input signal circuitry to thereby linearize said first and second output signals.

2. The apparatus according to claim 1 wherein said first current conducting device is a bipolar transistor having base, emitter and collector electrodes.

3. The apparatus according to claim 2 including means for coupling said second potential to the base electrode of said transistor, and wherein said means for coupling said second potential to said second impedance comprises a connection between the first terminal of said second impedance and the emitter of said bipolar transistor.

4. The apparatus according to claims 1, 2, or 3, further comprising:
   a third impedance of substantially the same impedance as said first impedance having first and second terminals and means for coupling said third potential to the first terminal of said third impedance;
   a second current conducting device similar to said first current conducting device having an input electrode coupled to the other of said first and second output signal circuits of said constant current generating means from that coupled to the input electrode of said first current conducting device, having an output electrode coupled to the second terminal of said third impedance, and having a control electrode; and
   means for coupling said second potential to the control electrode of said second current conducting device.

5. In a high voltage amplifier of the type for providing an amplified high voltage output of an input signal when coupled to a first fixed potential, a second fixed potential, and a third fixed potential, with said second and third potentials having respective differences from said first potential that are relatively small and large respectively, said amplifier including constant current generating means coupled between said first and second potentials for providing at first and second outputs thereof first and second current signals which current sum is a constant current, said means including control input circuitry and responsive to signals applied thereto for producing complementary variations of said first and second current signals at said first and second outputs, respectively; a current conducting device having input and output electrodes; a first impedance; and means coupling said current conducting device in series with said first impedance between said third potential and said first output of said constant current generating means; a linearizing means in combination therewith comprising:
   a second impedance connected between said second potential and one of said first and second outputs for producing a voltage thereacross proportional to the current through said one of said first and second outputs; and
   degenerative feedback means coupled to said input signal circuitry and responsive to the voltage across said second impedance for providing a signal proportional to said voltage to said control input circuitry to thereby linearize said first and second output signals.

* * * * *